United States Patent [19]

Shieh

[11] Patent Number: 4,745,085

[45] Date of Patent: May 17, 1988

[54] METHOD OF MAKING I²L HETEROSTRUCTURE BIPOLAR TRANSISTORS

[75] Inventor: Chan-Long Shieh, Plainsboro, N.J.

[73] Assignee: Siemens Corporate Research & Support, Inc., Iselin, N.J.

[21] Appl. No.: 936,676

[22] Filed: Dec. 1, 1986

Related U.S. Application Data

[62] Division of Ser. No. 721,257, Apr. 8, 1985, Pat. No. 4,644,381.

[51] Int. Cl.⁴ .............................................. H01L 21/20
[52] U.S. Cl. ........................................ 437/55; 437/32; 437/234; 437/126; 437/133; 437/31; 148/DIG. 11
[58] Field of Search ............... 357/35, 16, 15, 44, 357/92; 29/576 E, 590; 148/1.5, DIG. 87, DIG. 50, DIG. 11, 175; 156/652, 656; 437/31, 55, 32, 33, 126, 133, 234

[56] References Cited

U.S. PATENT DOCUMENTS

| | | | |
|---|---|---|---|
| 4,072,545 | 2/1978 | De La Moneda | 148/1.5 |
| 4,160,988 | 7/1979 | Russell | 148/1.5 |
| 4,550,491 | 11/1985 | Pepey | 29/576 E |

*Primary Examiner*—Brian E. Hearn
*Assistant Examiner*—Kevin McAndrews
*Attorney, Agent, or Firm*—John Francis Moran

[57] ABSTRACT

A process of making an integrated injection logic (I²L) semiconductor structure is disclosed which is particularly advantageous for implementation in a group III-V compound semiconductor such as gallium arsenide. By use of "regrowth" techniques, the base region of the lateral transistor is made extremely thin (less than one-tenth micron). Utilization of a Schottky collector in a vertical transistor simplifies the structure.

5 Claims, 1 Drawing Sheet

METHOD OF MAKING I²L HETEROSTRUCTURE BIPOLAR TRANSISTORS

This is a division of application Ser. No. 721,257, filed Apr. 8, 1985, now U.S. Pat. No. 4,644,381.

BACKGROUND OF THE INVENTION

The present invention relates to a semiconductor structure for integrated injection logic (I²L). More particularly, the invention relates to I²L transistor structure and a method of making such transistor structure.

Integrated injection logic (I²L) has been known in the art for over ten years. Solid state circuits formed of bipolar transistors using I²L technology have the advantage of high speed, low power and high device packing density. This high packing density is achieved with the elimination of isolation by using transistors with a common emitter at the bottom of the devices. I²L on silicon is now widely used for VLSI applications.

The switching speed of silicon devices is limited by the long minority carrier lifetime in silicon and the low emitter efficiency resulting from the doping profile. The carrier lifetime in group III-V compound semiconductors is usually shorter, however, and the emitter efficiency can be improved, irrespective of the doping profile, by use of heterojunction emitters; i.e., by emitters formed by PN junctions between different materials. Therefore, III-V compound semiconductors are ideal materials for implementing I²L. III-V compound semiconductors have the further advantage of providing high mobility for charge carriers and permitting the formation of graded bandgaps to reduce the transit time. Therefore, I²L on III-V compound semiconductors is a promising technology for high speed VLSI.

The fabrication of I²L circuits on III-V compound semiconductors is hindered, however, by the difficulty in preparing a lateral transistor. The minority carrier diffusion length in a III-V compound semiconductor is very short (less than one micron). Since the base width in the lateral transistor must be smaller than this diffusion length, the definition of the base of a lateral transistor by lithography (diffusion) is nearly impractical.

The use of III-V compound semiconductors in the fabrication of I²L also results in difficulty in making ohmic contact to the various layers which are buried in the structure. Since the different layers in the I²L structure must be very thin to achieve high speed, it becomes difficult to achieve controlled ohmic contact to selected ones of these layers.

The German "Offenlegungsschrift" No. 2,509,530 discloses various types of I²L transistor structure. FIGS. 10A and 10B of this patent publication disclose a vertical, or so-called "inverted" transistor formed with a Schottky collector. The use of the Schottky (metal-to-semiconductor) junction is said to eliminate an extra collector doping step.

The British Patent No. 1,528,029 discloses an I²L semiconductor device formed of a lateral PNP transistor and a vertical NPN transistor. The injector region and the base region of the PNP transistor are formed by double diffusion to enable the base region to have a substantially uniform, but narrow width. As mentioned above, however, the base formation by diffusion in a III-V compound semiconductor is impractical because the base width must be substantially less than one micron.

SUMMARY OF THE INVENTION

An object of the present invention is to provide a method of making transistors for integrated injection logic in a III-V compound semiconductor that permits the fabrication of a thin and uniform base for the lateral transistor.

A further object of the present invention is to provide a method of making transistors in I²L configuration which facilitates the fabrication of controllable ohmic contacts to different layers of the structure.

These objects, as well as other objects which will become apparent in the discussion that follows are achieved, according to the present invention, by the use of regrowth techniques for forming the lateral transistor structure and the use of a Schottky collector to simplify the vertical transistor structure.

The lateral transistor is fabricated by regrowth with the following steps:

(a) growing, on one side of a substrate of a first conductivity type, an epitaxial first layer of the same first conductivity type;

(b) growing an epitaxial second layer on the first layer, with the second layer having a second conductivity type opposite to that of the first conductivity type;

(c) depositing on this second layer an insulating third layer;

(d) etching a first opening in the third and second layers to the depth of the first layer;

(e) growing an epitaxial fourth layer of the first conductivity type in the first opening;

(f) growing an epitaxial fifth layer of the second conductivity type on the fourth layer in the first opening;

(g) etching a second opening in the third, fourth and fifth layers to the depth of the second layer;

(h) depositing an ohmic first contact on the fifth layer over the first opening, thereby contacting the emitter of the lateral transistor, and depositing an ohmic second contact on the second layer through the second opening, thereby contacting the collector of the lateral transistor; and (i) depositing an ohmic third contact on the opposite side of the substrate, thereby contacting the base of the lateral transistor.

The vertical transistor is fabricated adjacent to the lateral transistor by:

(j) etching a third opening in the third, fourth and fifth layers to the depth of the second layer; and (k) depositing a Schottky fourth contact in the third opening on the second layer, thereby forming the collector of the vertical transistor. The emitter of the vertical transistor is contacted by the aforementioned second contact.

Although the use of regrowth techniques and Schottky collectors are known in the art, the present invention makes advantageous use of new combinations of processing steps in this technology to define a new I²L semiconductor structure. Advantageously, the regrowth techniques permit the base of the lateral transistor to be fabricated with a very narrow width; e.g., less than one-tenth micron.

For a full understanding of the present invention, reference should now be made to the following detailed description of the preferred embodiments of the invention and to the accompanying drawings.

DESCRIPTION OF THE PREFERRED EMBODIMENTS

Figure 1:
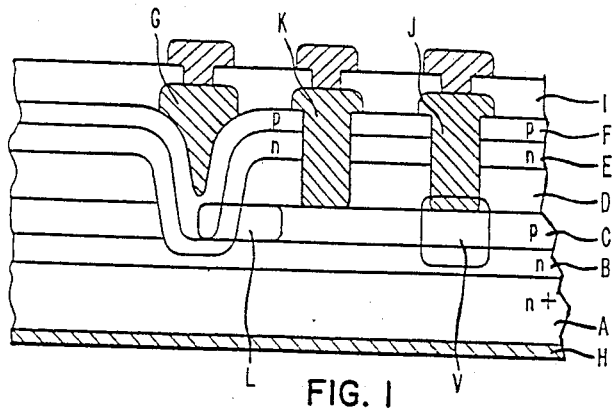
FIG. 1 is a cross-sectional view of an I²L semiconductor structure according to a preferred embodiment of the present invention.

The preferred embodiments of the present invention will now be described with reference to FIGS. 1 and 2 of the drawings. Identical elements in the various figures are designated with the same reference numerals (letters).

FIG. 1 illustrates the full structure of the heterostructure I²L circuit according to the invention. Two bipolar transistors comprise the I²L circuit: a lateral pnp transistor indicated by the heavy line surrounding the area L and a vertical npn transistor indicated by the heavy line surrounding the area V (or interchangeably, a lateral npn and vertical pnp transistor, respectively). Either one of these combinations can be used with this circuit. The vertical transistor V is composed of layers B, C and J where B is the emitter, C is the base and J is the Schottky collector. The lateral transistor L is composed of layers F, E, C where F is the emitter, E is the base and C is the collector.

The polarities of layers B and E should be the same as that of the substrate A and the polarities of layers C and F should be opposite to that of the substrate A. The bandgap of all these layers can be uniform or graded. For speed enhancement, the bandgap of layer B and C should decrease as it goes upwards. In order to take advantage of the concept of heterojunction emitter and carrier confinement, the bandgap of layer B should be larger than that of layer C and E. The bandgap of layer F should be larger than that of E. The bandgap of layer E should be larger than that of C, as illustrated in the forthcoming examples.

To fabricate the devices a III-V compound semiconductor such as gallium arsenide (GaAs) is preferably used as substrate A. Two consecutive epitaxial layers B and C are grown, B and C having the appropriate polarity according to the substrate. A layer D of insulating material is deposited and patterned. The insulator layer D is used as a mask for etching the semiconductor layer C. Two epitaxial semiconductor layers E and F are then deposited over the layers B, C and D. This technology is known as "regrowth". The material deposited over the insulator layer D will become semi-insulating because it is polycrystalline.

The epitaxial layers B and C and the regrowth of layers E and F can be done by common epitaxy technologies such as molecular beam epitaxy (MBE), liquid phase epitaxy (LPE), vapor phase epitaxy (VPE) and/or metal organic chemical vapor deposition (MOCVD).

To fabricate the I²L circuit contacts have to be established to the following layers: ohmic contacts G and K to layers F and C and a Schottky contact J to layer C as is illustrated in FIG. 2.

Since the portions of layers F and E above the insulator layer D are semi-insulating, they provide the isolation of the devices.

The contacts to the transistor are established as follows:

An opening for the ohmic contact to layer C is etched through the insulating layers F and E. After patterning, ohmic contacts G and K are applied simultaneously to both F and C, respectively. Ohmic contact H is then formed on the back of the substrate to connect the common emitter. An insulator layer I is desposited on top and patterned for the contact opening for the Schottky contact to layer C as well as for contact holes to contacts G and K. The Schottky metal J is then deposited and patterned to form the necessary interconnections.

Figure 2A:
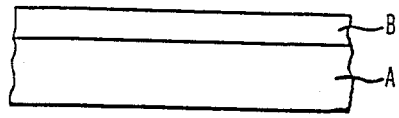
FIGS. 2A, 2B, 2C, 2D, 2E and 2F are cross-sectional views which illustrate the steps of manufacturing the lateral transistor of an I²L circuit according to the invention.
Figure 2D:
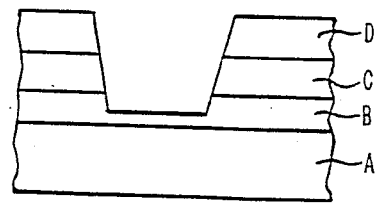
Figure 2B:
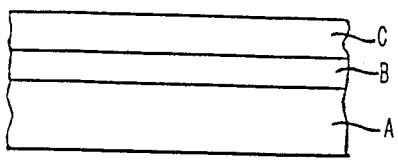
Figure 2E:
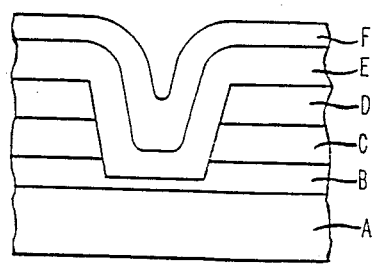
Figure 2C:
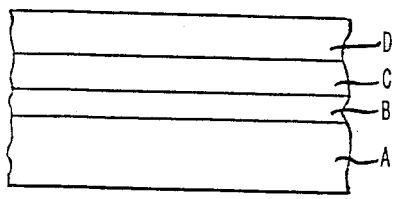

The steps for fabricating the lateral transistor are illustrated in FIGS. 2A–2F. FIG. 2A shows a substrate A, which may be a gallium arsenide substrate with n+ conductivity, supporting an epitaxial layer B of n conductivity. Thereafter, as shown in FIG. 2B, a first epitaxial layer C of the opposite conductivity type (p) is grown on the substrate A and layer B. In FIG. 2C, an insulating layer D, e.g., of silicon nitride, is deposited on the layer C.

The insulator layer D is used as a mask to etch into the semiconductor structure. FIG. 2D shows how an opening has been etched into the layers C and B through a window formed by the layer D. Thereafter, layers E and F of the first and second conductivity types, respectively, are epitaxially grown in the region of the opening and on top of the insulator layer D. The material grown on top of the insulator layer will be polycrystalline, and therefore semi-insulating.

Figure 2F:
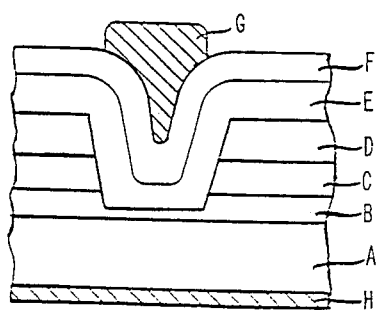

Finally, as shown in FIG. 2F, ohmic contact metal G is deposited in the trench formed by the layers E and F to contact the emitter of the lateral transistor. Ohmic contact metal H is also deposited on the opposite side of the substrate A to contact the base of this transistor.

The Schottky contact for the vertical transistor may be made by opening a hole in the layers F, E and D, down to the layer C. The etchant used in forming the hole, which may be Freon 14 ($CF_4$) for example, will stop at the layer C because it preferentially attacks the silicon nitride layer D but not the gallium arsenide layer C.

EXAMPLES:

(1) Vertical npn and lateral pnp transistors with uniform base bandgap. The composition of all different layers is listed as follows:

A = n+-GaAs substrate
B = n-$Al_{0.3}Ga_{0.7}As$
C = p-GaAs
D = $Si_3N_4$
E = n-$Al_{0.1}Ga_{0.9}As$
F = p+-$Al_{0.3}Ga_{0.7}As$
G = Au: Be/Ti/Pt/Au
H = Au: Ge/Ni/Ti/Pt/Au
I = $Si_3N_4$
J = Ti/Pt/Au (2) Vertical pnp and lateral pnp transistors with uniform base composition.

A = p+-GaAs substrate
B = p-$Al_{0.3}Ga_{0.7}As$
C = n-GaAs
D = $Si_3N_4$
E = p-$Al_{0.1}Ga_{0.9}As$
F = n+-$Al_{0.3}Ga_{0.7}As$
G = Au: Ge/Ni/Ti/Pt/Au
H = Au: Be/Ti/Pt/Au I = Ti/Pt/Au (3) Vertical npn and lateral pnp transistors with graded base bandgap.

A = n+GaAs substrate
B = n-$Al_{0.3}Ga_{0.7}As$
C = graded from p-$Al_{0.1}Ga_{0.9}As$ (bottom) to p-GaAs (top)
D = $Si_3N_4$
E = graded from n-$Al_{0.1}Ga_{0.9}As$ (bottom) to n-$Al_{0.2}Ga_{0.8}As$ (top)
F = p+-$Al_{0.3}Ga_{0.7}As$
G = Au: Be/Ti/Pt/Au
H = Au: Ge/Ni/Ti/Pt/Au
I = $Si_3S_4$
J = Ti/Pt/Au (4) Vertical pnp and lateral npn transistors with graded base bandgap.

A = p+-GaAs substrate
B = p-$Al_{0.3}Ga_{0.7}As$
C = graded from n-$Al_{0.1}Ga_{0.9}As$ (bottom) to n-GaAs (top)
D = $Si_3N_4$
E = graded from p-$Al_{0.1}Ga_{0.9}As$ (bottom) to p-$Al_{0.2}Ga_{0.8}As$ (top)
F = n+-$Al_{0.3}Ga_{0.2}As$
G = Au: Ge/Ni/Ti/Pt/Au
H = Au: Be/Ti/Pt/Au
I = $Si_3N_4$
J = Ti/Pt/Au There has thus been shown and described a novel $I^2L$ circuit which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method of fabricating transistors for integrated injection logic, said method comprising the steps of:

(a) growing, on one side of a substrate of III-V compound semiconductor material having a first conductivity type, an epitaxial first layer of the same, first conductivity type;
    (b) growing an epitaxial second layer on said first layer, said second layer having a second conductivity type opposite to that of said first conductivity type;
    (c) depositing an insulating third layer on said second layer;
    (d) etching a first opening in said second and third layers to the depth of said first layer;
    (e) growing an epitaxial fourth layer of semi-insulating polycrystalline material of said second conductivity type on said fourth layer in said first opening;
    (f) growing an epitaxial fifth layer of semi-insulating polycrystalline material of said second conductivity type on said fourth layer in said first opening;
    (g) etching a second opening in said third, fourth and fifth layers to the depth of said second layer;
    (h) depositing an ohmic first contact on said fifth layer over said first opening, thereby contacting the emitter of a lateral transistor and depositing an ohmic second contact on said second layer through said second opening, thereby contacting the collector of the lateral transistor; and
    (i) depositing an ohmic third contact on the opposite side of said substrate, thereby contacting the base of said lateral transistor;
    whereby the base region of said lateral transistor is formed by said fourth layer.

2. The method defined in claim 1, further comprising the steps of:

(j) etching a third opening in said third, fourth and fifth layers to the depth of said second layer;
    (k) depositing a Schottky fourth contact in said third opening on said second layer, thereby forming the collector of a vertical transistor.

3. The method defined in claim 1, wherein said fourth layer is less than one-tenth micron thick.

4. The method defined in claim 1, wherein said fourth layer is formed with a graded bandgap.

5. The method defined in claim 1, wherein said first conductivity type is negative (n) and said second conductivity type is positive (p).

* * * * *